United States Patent
Yokoyama et al.

(10) Patent No.: US 7,915,813 B2
(45) Date of Patent: Mar. 29, 2011

(54) ORGANIC EL DISPLAY DEVICE AND METHOD OF MANUFACTURING THE SAME

(75) Inventors: Shuhei Yokoyama, Ishikawa-gun (JP); Masuyuki Oota, Hakusan (JP); Satoshi Okutani, Ishikawa-gun (JP); Takanobu Takenaka, Sakai (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 1 day.

(21) Appl. No.: 12/408,993

(22) Filed: Mar. 23, 2009

(65) Prior Publication Data

US 2009/0243466 A1 Oct. 1, 2009

(30) Foreign Application Priority Data

Mar. 31, 2008 (JP) .................................. 2008-093438
Apr. 25, 2008 (JP) .................................. 2008-115802

(51) Int. Cl.
*H05B 33/00* (2006.01)
(52) U.S. Cl. ............ 313/504; 303/506; 303/512; 445/23
(58) Field of Classification Search .......... 313/504–512; 445/23–25; 428/690, 977
See application file for complete search history.

(56) References Cited

U.S. PATENT DOCUMENTS

2008/0238297 A1  10/2008  Oota

FOREIGN PATENT DOCUMENTS

| JP | 2003-157973 | 5/2003 |
|---|---|---|
| JP | 2006-092936 | 4/2006 |
| JP | 3849066 | 9/2006 |
| JP | 2006-324016 | 11/2006 |
| JP | 2007-108248 | 4/2007 |
| JP | 2007-299729 | 11/2007 |
| JP | 2009-535779 | 10/2009 |
| KR | 2000-0011034 | 2/2000 |
| KR | 2007-0108075 | 11/2007 |
| WO | WO 97/43874 | 11/1997 |

OTHER PUBLICATIONS

U.S. Appl. No. 12/683,603, filed Jan. 7, 2010, Yokoyama, et al.
U.S. Appl. No. 12/250,134, filed Oct. 13, 2008, Yokoyama, et al.
U.S. Appl. No. 12/535,977, filed Aug. 5, 2009, Yokoyama, et al.
Japanese Office Action issued on Jun. 22, 2010, with English translation (8 pages).
Korean Office Action (with Engish translation) issued on Oct. 27, 2010, in Korean Patent Appln. No. 10-2009-26850 (8 pages).

*Primary Examiner* — Joseph L Williams
(74) *Attorney, Agent, or Firm* — Oblon, Spivak, McClelland, Maier & Neustadt, L.L.P.

(57) ABSTRACT

An organic EL display device includes a first light emission layer which includes a first dopant material having a first absorbance peak in absorbance spectrum characteristics and a first host material having a first absorbance bottom on a shorter wavelength side than the first absorbance peak, the first light emission layer extending over the first to third organic EL elements and being disposed above pixel electrodes of the first to third organic EL elements, and a second light emission layer which includes a second dopant material having a second absorbance peak in absorbance spectrum characteristics and a second host material having a second absorbance bottom on a shorter wavelength side than the first absorbance peak and than the second absorbance peak, the second light emission layer extending over the first to third organic EL elements and being disposed above the first light emission layer.

14 Claims, 9 Drawing Sheets

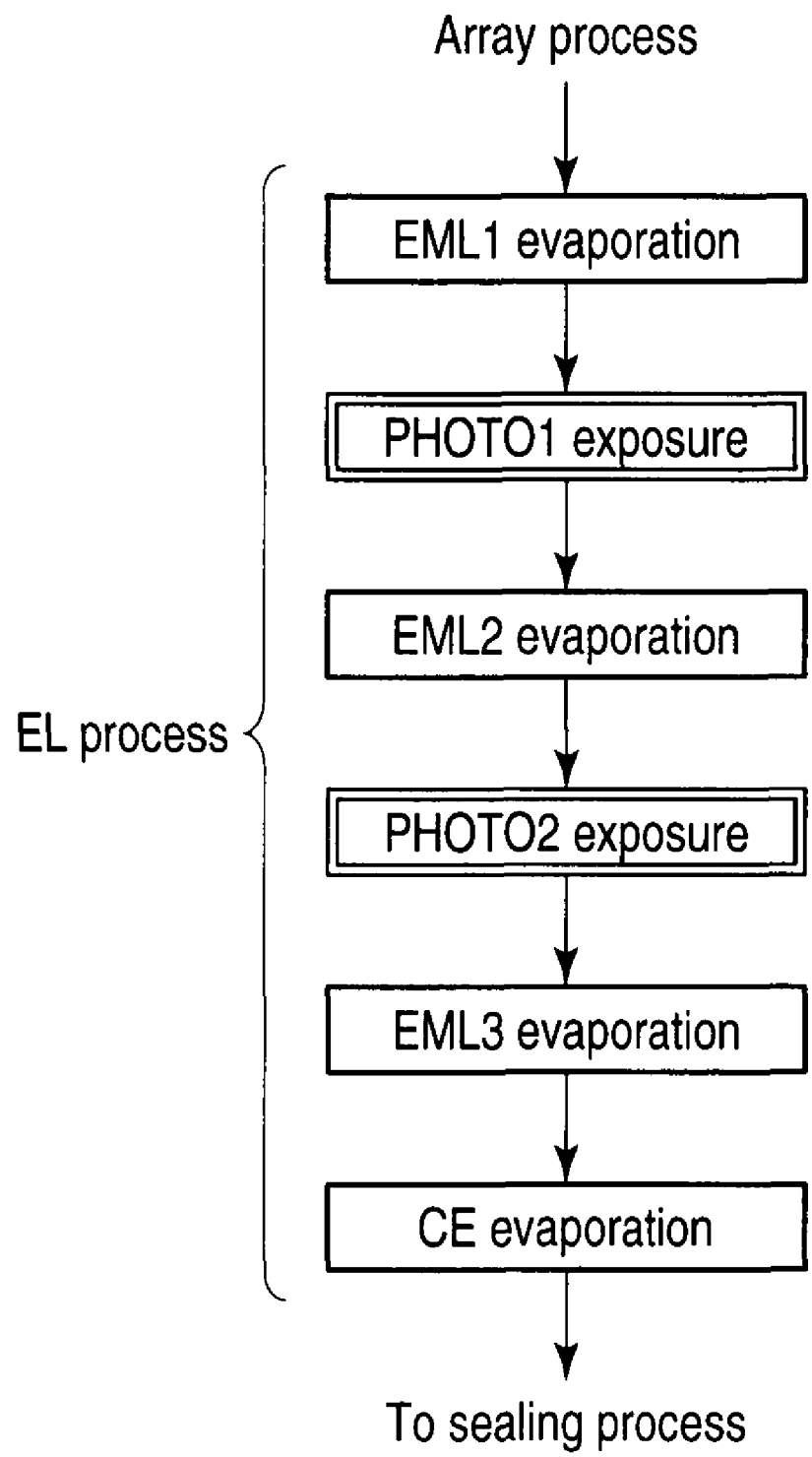
F I G. 7

ORGANIC EL DISPLAY DEVICE AND METHOD OF MANUFACTURING THE SAME

CROSS-REFERENCE TO RELATED APPLICATIONS

This application is based upon and claims the benefit of priority from prior Japanese Patent Applications No. 2008-093438, filed Mar. 31, 2008; and No. 2008-115802, filed Apr. 25, 2008, the entire contents of both of which are incorporated herein by reference.

BACKGROUND OF THE INVENTION

1. Field of the Invention

The present invention relates to an organic electroluminescence (EL) display device.

2. Description of the Related Art

In recent years, display devices using organic electroluminescence (EL) elements have vigorously been developed, by virtue of their features of self-emission, a high response speed, a wide viewing angle, a high contrast, small thickness and light weight.

In the organic EL element, holes are injected from a hole injection electrode (anode), electrons are injected from an electron injection electrode (cathode), and the holes and electrons are recombined in a light emitting layer, thereby producing light. In order to obtain full-color display, it is necessary to form pixels which emit red (R) light, green (G) light and blue (B) light, respectively. It is necessary to selectively apply light-emitting materials, which emit lights with different light emission spectra, such as red, green and blue, to light-emitting layers of organic EL elements which constitute the red, green and blue pixels. As a method for selectively applying such light-emitting materials, there is known a vacuum evaporation method. In the case of forming films of low-molecular-weight organic EL materials by such a vacuum evaporation method, there is a method in which mask evaporation is performed independently for respective color pixels by using a metallic fine mask having openings in association with the respective color pixels (see, e.g. Jpn. Pat. Appln. KOKAI Publication No. 2003-157973).

In the mask evaporation method using the metallic fine mask, however, pixels become very fine in the case where a high fineness (resolution) is required for the display device. As a result, a so-called color mixture defect, by which light-emitting materials of respective colors are mixed, occurs frequently, and full-color display with high fineness is difficult realize.

BRIEF SUMMARY OF THE INVENTION

According to an aspect of the present invention, there is provided an organic EL display device comprising: a pixel electrode which is disposed in each of first to third organic EL elements having different emission light colors; a first light emission layer which includes a first dopant material having a first absorbance peak in absorbance spectrum characteristics and a first host material having a first absorbance bottom on a shorter wavelength side than the first absorbance peak, the first light emission layer extending over the first to third organic EL elements and being disposed above the pixel electrodes of the first to third organic EL elements; a second light emission layer which includes a second dopant material having a second absorbance peak in absorbance spectrum characteristics and a second host material having a second absorbance bottom on a shorter wavelength side than the first absorbance peak and than the second absorbance peak, the second light emission layer extending over the first to third organic EL elements and being disposed above the first light emission layer; a third light emission layer which includes a third dopant material and a third host material, the third light emission layer extending over the first to third organic EL elements and being disposed above the second light emission layer; and a counter-electrode which extends over the first to third organic EL elements and is disposed above the third light emission layer.

According to another aspect of the present invention, there is provided an organic EL display device comprising: a pixel electrode which is disposed in each of first to third organic EL elements having different emission light colors; a first light emission layer which includes a first dopant material having a first absorbance peak and a first host material having a first absorbance bottom, at which a normalized absorbance in normalized absorbance spectrum characteristics is 10% or less, on a shorter wavelength side than the first absorbance peak, the first light emission layer extending over the first to third organic EL elements and being disposed above the pixel electrodes of the first to third organic EL elements; a second light emission layer which includes a second dopant material having a second absorbance peak and a second host material having a second absorbance bottom, at which a normalized absorbance in normalized absorbance spectrum characteristics is 10% or less, on a shorter wavelength side than the first absorbance peak and than the second absorbance peak, the second light emission layer extending over the first to third organic EL elements and being disposed above the first light emission layer; a third light emission layer which includes a third dopant material and a third host material, the third light emission layer extending over the first to third organic EL elements and being disposed above the second light emission layer; and a counter-electrode which extends over the first to third organic EL elements and is disposed above the third light emission layer.

According to still another aspect of the present invention, there is provided a manufacturing method of an organic EL display device, comprising: a step of forming a pixel electrode in association with each of first to third organic EL elements having different emission light colors; a step of forming above the pixel electrode a first light emission layer by using a first dopant material having a first absorbance peak in absorbance spectrum characteristics and a first host material having a first absorbance bottom on a shorter wavelength side than the first absorbance peak, the first light emission layer extending over the first to third organic EL elements; a step of forming above the first light emission layer a second light emission layer by using a second dopant material having a second absorbance peak in absorbance spectrum characteristics and a second host material having a second absorbance bottom on a shorter wavelength side than the first absorbance peak and than the second absorbance peak, the second light emission layer extending over the first to third organic EL elements; a step of forming above the second light emission layer a third light emission layer by using a third dopant material and a third host material, the third light emission layer extending over the first to third organic EL elements; and a step of forming above the third light emission layer a counter-electrode which extends over the first to third organic EL elements.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is a flow chart for describing a manufacturing method for manufacturing the first to third organic EL elements shown in FIG. 3;

DETAILED DESCRIPTION OF THE INVENTION

Figure 1:
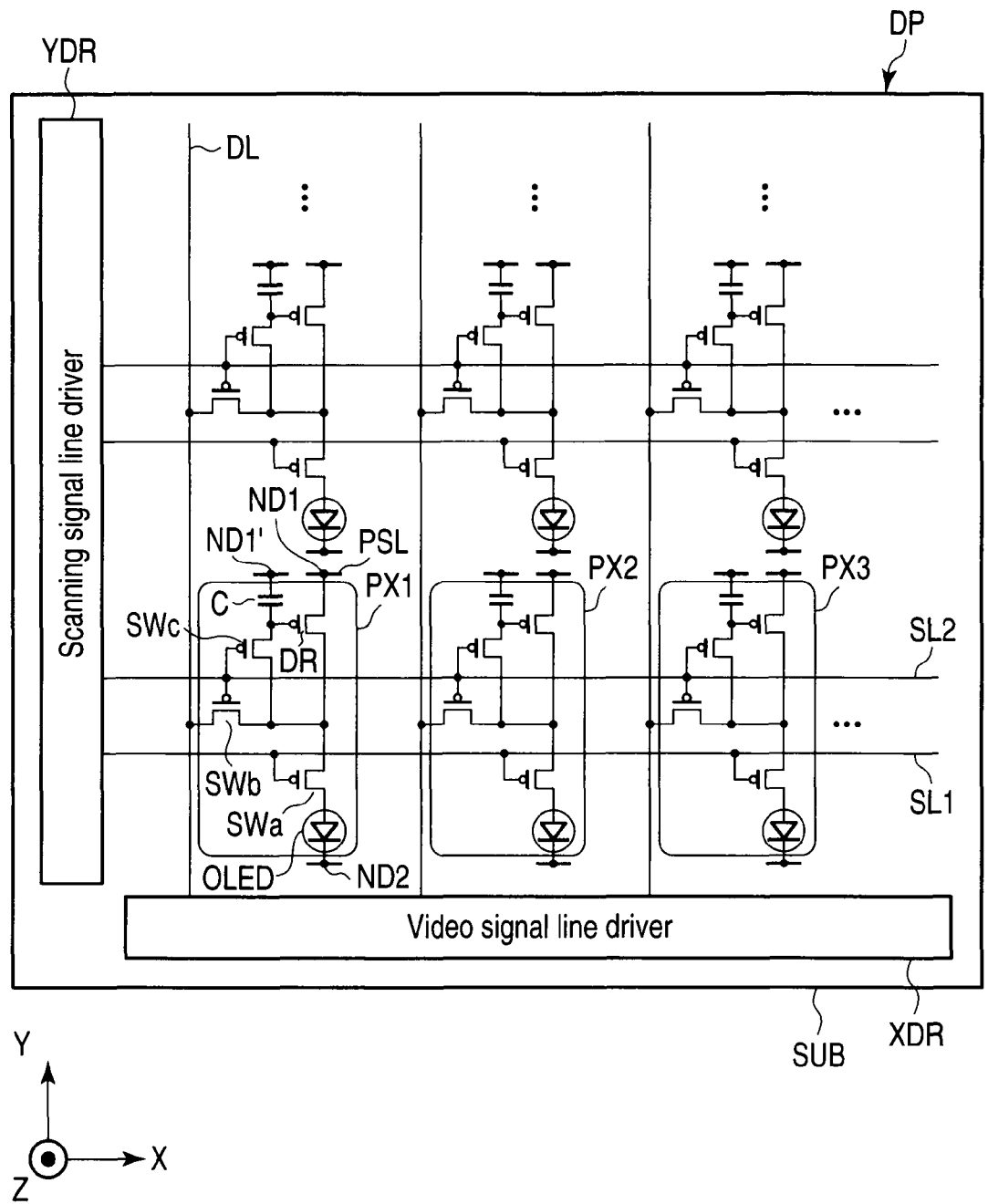
FIG. 1 schematically shows the structure of an organic EL display device according to an embodiment of the present invention.

An embodiment of the present invention will now be described in detail with reference to the accompanying drawings. In the drawings, structural elements having the same or similar functions are denoted by like reference numerals, and an overlapping description is omitted.

In the present embodiment, as an example of the organic EL display device, a description is given of an organic EL display device of a top emission type, which adopts an active matrix driving method.

As shown in FIG. 1, this display device includes a display panel DP. The display panel DP includes an insulative substrate SUB such as a glass substrate.

Pixels PX1 to PX3 are arranged in an X direction in the named order, and constitute a triplet (unit pixel) which is a minimum unit of a display pixel. In a display region, such triplets are arranged in the X direction and Y direction. Specifically, in the display region, a pixel string in which pixels PX1 are arranged in the Y direction, a pixel string in which pixels PX2 are arranged in the Y direction and a pixel string in which pixels PX3 are arranged in the Y direction are arranged in the X direction in the named order, and these three pixel strings are repeatedly arranged in the X direction.

Each of the pixels PX1 to PX3 includes a driving transistor DR, switching transistors SWa to SWc, an organic EL element OLED, and a capacitor C. In this example, the driving transistor DR and switching transistors SWa to SWc are p-channel thin-film transistors.

Scanning signal lines SL1 and SL2 extend in the X direction. Video signal lines DL extend in the Y direction. The driving transistor DR, switching transistor SWa and organic EL element OLED are connected in series in the named order between a first power supply terminal ND1 and a second power supply terminal ND2. In this example, the power supply terminal ND1 is a high-potential power supply terminal, and the power supply terminal ND2 is a low-potential power supply terminal. The power supply terminal ND1 is connected to a power supply line PSL.

The gate electrode of the switching transistor SWa is connected to the scanning signal line SL1. The switching transistor SWb is connected between the video signal line DL and the drain electrode of the driving transistor DR, and the gate electrode of the switching transistor SWb is connected to the scanning signal line SL2. The switching transistor SWc is connected between the drain electrode and gate electrode of the driving transistor DR, and the gate electrode of the switching transistor SWc is connected to the scanning signal line SL2. The capacitor C is connected between the gate electrode of the driving transistor DR and a constant potential terminal ND1'. In this example, the constant potential terminal ND1' is connected to the power supply terminal ND1.

The video signal line driver XDR and scanning signal line driver YDR are disposed, for example, on the substrate SUB. Specifically, the video signal line driver XDR and scanning signal line driver YDR are implemented by chip on glass (COG). The video signal line driver XDR and scanning signal line driver YDR may be implemented by tape carrier package (TCP), instead of COG. Alternatively, the video signal line driver XDR and scanning signal line driver YDR may be directly formed on the substrate SUB.

The video signal lines DL are connected to the video signal line driver XDR. The video signal line driver XDR outputs current signals as video signals to the video signal lines DL.

The scanning signal lines SL1 and SL2 are connected to the scanning signal line driver YDR. The scanning signal line driver YDR outputs voltage signals as first and second scanning signals to the scanning signal lines SL1 and SL2.

When an image is to be displayed on this organic EL display device, for example, the scanning signal lines SL2 are successively scanned. Specifically, the pixels PX1 to PX3 are selected on a row-by-row basis. In a selection period in which a certain row is selected, a write operation is executed in the pixels PX1 to PX3 included in this row. In a non-selection period in which this row is not selected, a display operation is executed in the pixels PX1 to PX3 included in this row.

In the selection period in which the pixels PX1 to PX3 of a certain row are selected, the scanning signal line driver YDR outputs, as voltage signals, scanning signals for opening (rendering non-conductive) the switching transistors SWa to the scanning signal line SL1 to which the pixels PX1 to PX3 are connected. Then, the scanning signal line driver YDR outputs, as voltage signals, scanning signals for closing (rendering conductive) the switching transistors SWb and SWc to the scanning signal line SL2 to which the pixels PX1 to PX3 are connected. In this state, the video signal line driver XDR outputs, as current signals (write current) $I_{sig}$, video signals to the video signal lines DL, and sets a gate-source voltage $V_{gs}$ of the driving transistor DR at a magnitude corresponding to the video signal $I_{sig}$.

Subsequently, the scanning signal line driver YDR outputs, as voltage signals, scanning signals for opening the switching transistors SWb and SWc to the scanning signal line SL2 to which the pixels PX1 to PX3 are connected, and then outputs, as voltage signals, scanning signals for closing the switching transistors SWa to the scanning signal line SL1 to which the pixels PX1 to PX3 are connected. Thus, the selection period ends.

In the non-selection period following the selection period, the switching transistors SWa are kept closed, and the switching transistors SWb and SWc are kept opened. In the non-selection period, a driving current $I_{drv}$, which corresponds in magnitude to the gate-source voltage $V_{gs}$ of the driving transistor DR, flows in the organic EL element OLED. The organic EL element OLED emits light with a luminance corresponding to the magnitude of the driving current $I_{drv}$. In this case, $I_{drv} \approx I_{sig}$, and emission light corresponding to the current signal (write current) $I_{sig}$ can be obtained in each pixel.

In the above-described example, the structure in which the current signal is written as the video signal is adopted in the pixel circuit for driving the organic EL element OLED. Alternatively, a structure in which a voltage signal is written as the video signal may be adopted in the pixel circuit. The invention is not restricted to the above-described example. In the present embodiment, use is made of p-channel thin-film transistors. Alternatively, n-channel thin-film transistors may be used, with the spirit of the invention being unchanged. The pixel circuit is not limited to the above-described example, and various modes may be applicable to the pixel circuit.

Figure 2:
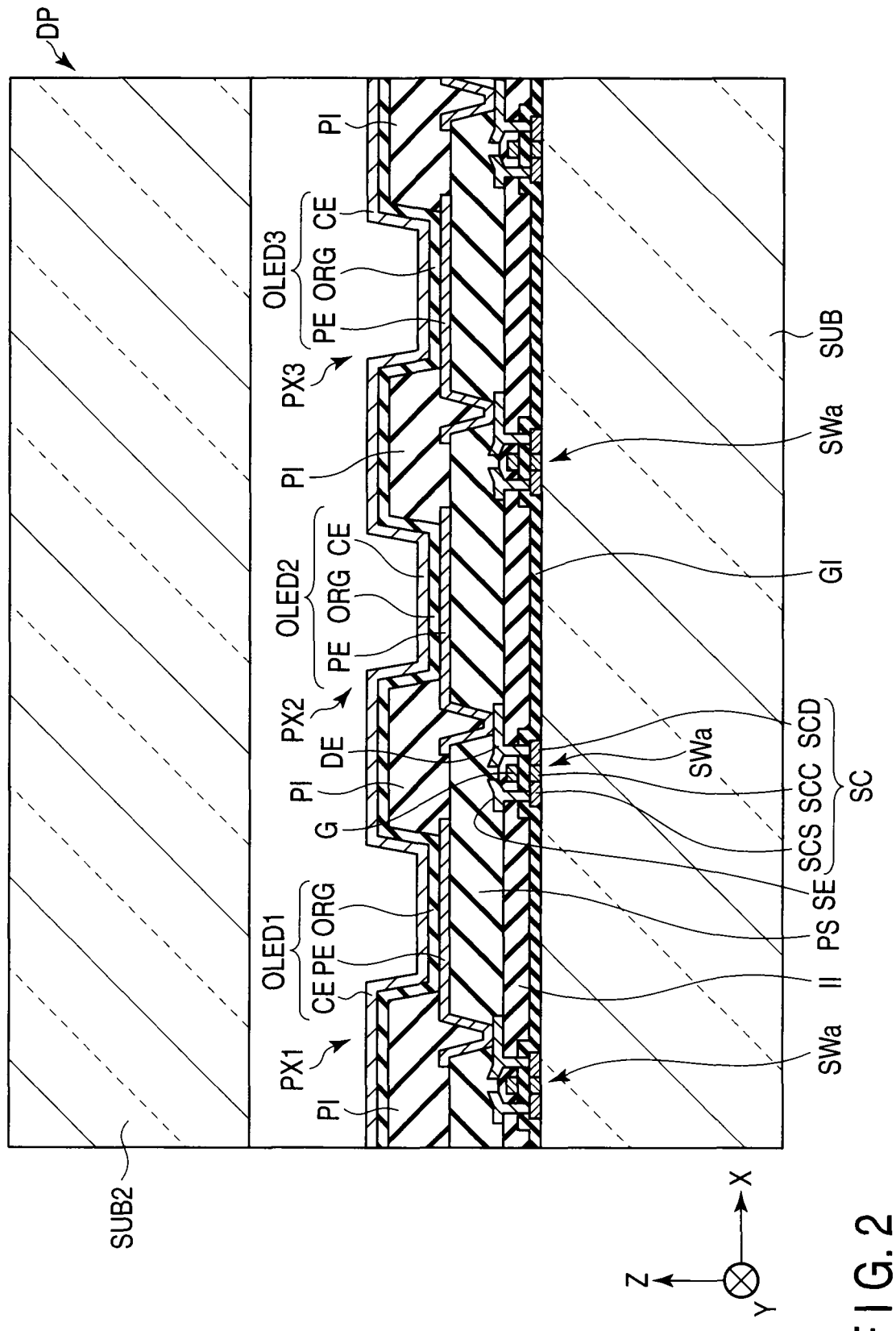
FIG. 2 is a cross-sectional view which schematically shows an example of the structure that is adoptable in the organic EL display device shown in FIG. 1.

FIG. 2 schematically shows the cross-sectional structure of the display panel DP which includes the switching transistor SWa and the organic EL element OLED.

As shown in FIG. 2, a semiconductor layer SC of the switching transistor SWa is disposed on the substrate SUB. The semiconductor layer SC is formed of, e.g. polysilicon. In the semiconductor layer SC, a source region SCS and a drain region SCD are formed, with a channel region SCC being interposed.

The semiconductor layer SC is coated with a gate insulation film GI. The gate insulation film GI is formed by using, e.g. tetraethyl orthosilicate (TEOS). The gate electrode G of the switching transistor SWa is disposed on the gate insulation film GI immediately above the channel region SCC. The gate electrode G is formed of, e.g. molybdenum-tungsten (MoW).

In this example, the switching transistor SWa is a top-gate-type p-channel thin-film transistor.

The gate insulation film GI and the gate electrode G are coated with an interlayer insulation film II. The interlayer insulation film II is formed by using, e.g. silicon oxide ($SiO_x$) which is deposited by, e.g. plasma chemical vapor deposition (CVD).

A source electrode SE and a drain electrode DE of the switching transistor SWa are disposed on the interlayer insulation film II. The source electrode SE is connected to the source region SCS of the semiconductor layer SC. The drain electrode DE is connected to the drain region SCD of the semiconductor layer SC.

The source electrode SE and drain electrode DE have, for example, a three-layer structure of molybdenum (Mo)/aluminum (Al)/molybdenum (Mo), and these parts can be formed by the same process. The source electrode SE and drain electrode DE are coated with a passivation film PS. The passivation film PS is formed by using, e.g. silicon nitride ($SiN_x$).

Pixel electrodes PE are disposed on the passivation film PS in association with the pixels PX1 to PX3. Each pixel electrode PE is connected to the drain electrode DE of the switching transistor SWa. In this example, the pixel electrode PE corresponds to an anode.

A partition wall PI is formed on the passivation film PS. The partition wall PI is disposed in a lattice shape in a manner to surround the entire periphery of the pixel electrode PE. The partition wall PI may be disposed in a stripe shape extending in the Y direction between the pixel electrodes PE. The partition wall PI is, for instance, an organic insulation layer. The partition wall PI can be formed by using, for example, a photolithography technique.

An organic layer ORG is disposed on each pixel electrode PE. The organic layer ORG includes at least one continuous film which extends over the display region including all pixels PX1 to PX3. Specifically, the organic layer ORG covers the pixel electrodes PE and partition wall PI. The details will be described later.

The organic layer ORG is coated with a counter-electrode CE. In this example, the counter-electrode CE corresponds to a cathode. The counter-electrode CE is a continuous film which extends over the display region including all pixels PX1 to PX3. In short, the counter-electrode CE is a common electrode which is shared by the pixels PX1 to PX3.

The pixel electrodes PE, organic layer ORG and counter-electrode CE constitute first to third organic EL elements OLED1 to OLED3 which are disposed in association with the pixels PX1 to PX3.

Specifically, the pixel PX1 includes the first organic EL element OLED1, the pixel PX2 includes the second organic EL element OLED2, and the pixel PX3 includes the third organic EL element OLED3. Although FIG. 2 shows one first organic EL element OLED1 of the pixel PX1, one second organic EL element OLED2 of the pixel PX2 and one third organic EL element OLED3 of the pixel PX3, these organic EL elements OLED1, OLED2 and OLED3 are repeatedly disposed in the X direction. Specifically, another first organic EL element OLED1 is disposed adjacent to the third organic EL element OLED3 that is shown on the right side part of FIG. 2. Similarly, another third organic EL element OLED3 is disposed adjacent to the first organic EL element OLED1 that is shown on the left side part of FIG. 2.

The partition wall PI is disposed between, and divides, the first organic EL element OLED1 and second organic EL element OLED2. In addition, the partition wall PI is disposed between, and divides, the second organic EL element OLED2 and third organic EL element OLED3. Further, the partition wall PI is disposed between, and divides, the third organic EL element OLED3 and first organic EL element OLED1.

The sealing of the first to third organic EL elements OLED1 to OLED3 may be effected by bonding a sealing glass substrate SUB2, to which a desiccant (not shown) is attached, by means of a sealant which is applied to the periphery of the display region. Alternatively, the sealing of the first to third organic EL elements OLED1 to OLED3 may be effected by bonding the sealing glass substrate SUB2 by means of frit glass (frit sealing), or by filling an organic resin layer between the sealing glass substrate SUB2 and the organic EL element OLED (solid sealing). In the case of the frit sealing, the desiccant may be dispensed with. In the case of the solid sealing, an insulation film of an inorganic material may be interposed between the organic resin layer and the counter-electrode CE.

In the present embodiment, the first to third organic EL elements OLED1 to OLED3 are configured to have different emission light colors. In this example, the emission light color of the first organic EL element OLED1 is red, the emission light color of the second organic EL element OLED2 is green, and the emission light color of the third organic EL element OLED3 is blue.

In general, the color of light in the range of wavelengths of 400 nm to 435 nm is defined as purple; the color of light in the range of wavelengths of 435 nm to 480 nm is defined as blue; the color of light in the range of wavelengths of 480 nm to 490 nm is defined as greenish blue; the color of light in the range of wavelengths of 490 nm to 500 nm is defined as bluish green; the color of light in the range of wavelengths of 500 nm to 560 nm is defined as green; the color of light in the range of wavelengths of 560 nm to 580 nm is defined as yellowish green; the color of light in the range of wavelengths of 580 nm to 595 nm is defined as yellow; the color of light in the range of wavelengths of 595 nm to 610 nm is defined as orange; the color of light in the range of wavelengths of 610 nm to 750 nm is defined as red; and the color of light in the range of wavelengths of 750 nm to 800 nm is defined as purplish red. In this example, the color of light with a major wavelength in the range of wavelengths of 400 nm to 490 nm is defined as blue; the color of light with a major wavelength, which is greater than 490 nm and less than 595 nm, is defined as green; and the color of light with a major wavelength in the range of wavelengths of 595 nm to 800 nm is defined as red.

Figure 3:
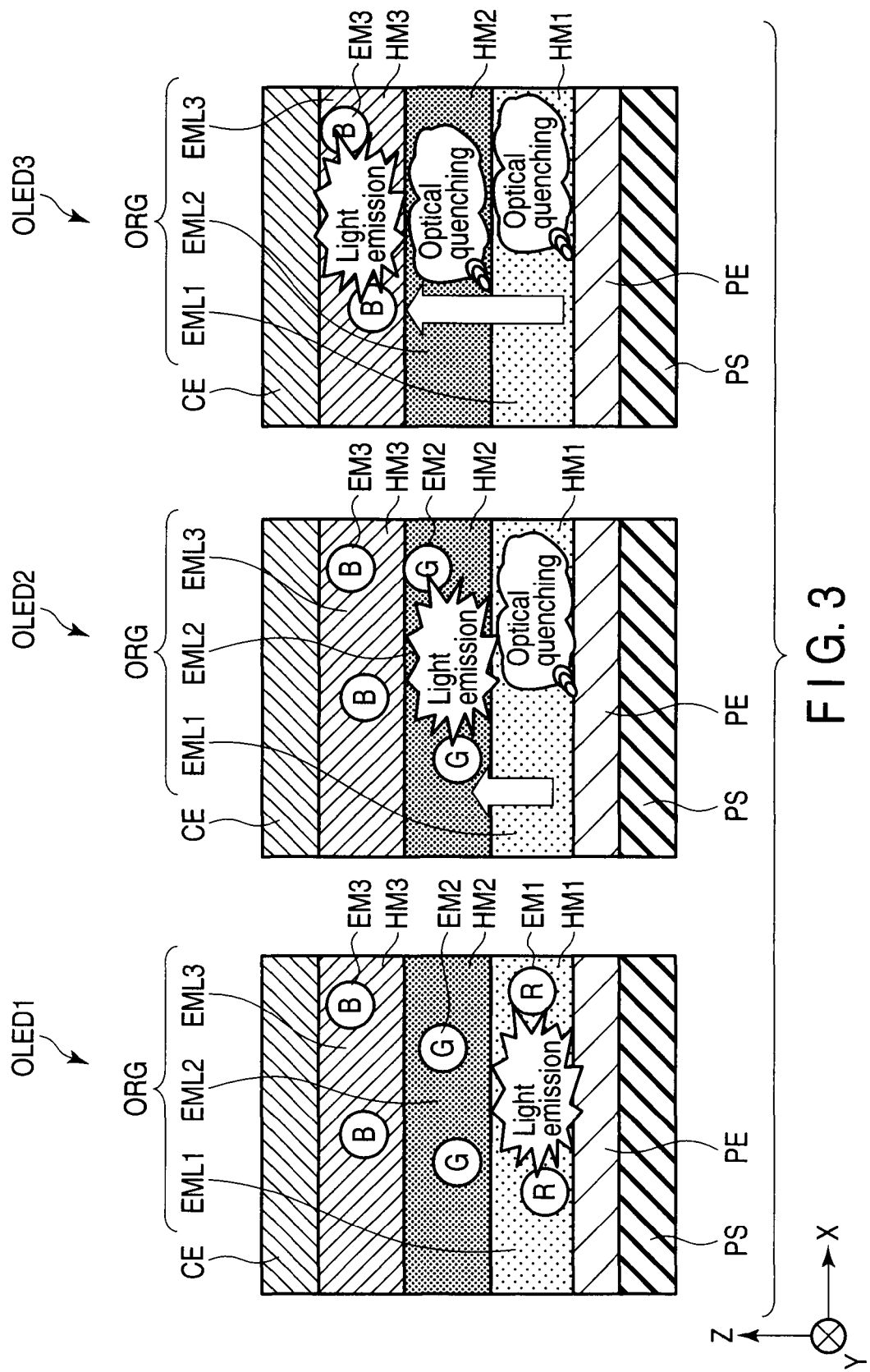
FIG. 3 shows one principle for controlling the emission light colors of first to third organic EL elements.

FIG. 3 schematically shows the structure of each of the first to third organic EL elements OLED1 to OLED3. As shown in FIG. 3, each of the first organic EL element OLED1 of the pixel PX1, the second organic EL element OLED2 of the pixel PX2 and the third organic EL element OLED3 of the pixel PX3 is disposed on the passivation film PS. Each of the first to third organic EL elements OLED1 to OLED3 includes a pixel electrode PE, a counter-electrode CE that is opposed to the pixel electrode PE, and an organic layer ORG that is interposed between the pixel electrode PE and counter-electrode CE.

The first to third organic EL elements OLED1 to OLED3 are structured as described below.

Specifically, the pixel electrode PE is disposed on the passivation film PS. The organic layer ORG is disposed on the pixel electrode PE. The organic layer ORG includes a red light emission layer EML1 which is a first light emission layer disposed on the pixel electrode PE, a green light emission layer EML2 which is a second light emission layer disposed on the red light emission layer EML1, and a blue light emission layer EML3 which is a third light emission layer disposed on the green light emission layer EML2. The counter-electrode CE is disposed on the organic layer ORG.

The red light emission layer EML1 is formed of a mixture of a first host material HM1 and a first dopant material EM1 whose emission light color is red. The first dopant material EM1 is a red light-emitting material which is formed of a luminescent organic compound or composition having a central light emission wavelength in red wavelengths. The red light emission layer EML1 is formed, for example, by using 9,9-bis (9-phenyl-9H-carbazole) fluorine (abbreviation: FL-2CBP) as the first host material HM1, and 4-(dicyanomethylene)-2-methyl-6-(julolidin-4-yl-vinyl)-4H-pyran (DCM2) as the first dopant material EM1.

The characteristics which the first host material HM1 is required to have are such absorbance spectrum characteristics as to have an absorbance bottom on a shorter wavelength side than an absorbance peak in absorbance spectrum characteristics of the first dopant material EM1.

The green light emission layer EML2 is formed of a mixture of a second host material HM2 and a second dopant material EM2 whose emission light color is green. The second dopant material EM2 is a green light-emitting material which is formed of a luminescent organic compound or composition having a central light emission wavelength in green wavelengths. The green light emission layer EML2 is formed, for example, by using FL-2CBP as the second host material HM2, and tris(8-hydroxyquinolato)aluminum (abbreviation: $Alq_3$) as the second dopant material EM2.

The characteristics which the second host material HM2 is required to have are such absorbance spectrum characteristics as to have an absorbance bottom on a shorter wavelength side than absorbance peaks in absorbance spectrum characteristics of the first dopant material EM1 and second dopant material EM2.

The blue light emission layer EML3 is formed of a mixture of a third host material HM3 and a third dopant material EM3 whose emission light color is blue. The third dopant material EM3 is a blue light-emitting material which is formed of a luminescent organic compound or composition having a central light emission wavelength in blue wavelengths. The blue light emission layer EML3 is formed, for example, by using 4,4'-bis(2,2'-diphenyl-ethen-1-yl)-diphenyl (BPVBI) as the third host material, and perylene as the third dopant material EM3.

As the first host material HM1 and second host material HM2, use may be made of 1,3,5-tris (carbazole-9-yl) benzene (abbreviation: TCP), aside from the above-described examples. Other materials may also be used.

Materials, other than the above-described examples, may be used as the first dopant material EM1, second dopant material EM2 and third dopant material EM3. At least one of the first dopant material EM1, second dopant material EM2 and third dopant material EM3 may be a phosphorescent material.

A description is given of the principle for controlling the emission light colors in the first to third organic EL elements OLED1 to OLED3.

The band gap of the first dopant material EM1 is smaller than the band gap of each of the second dopant material EM2 and third dopant material EM3. The band gap of the second dopant material EM2 is smaller than the band gap of the third dopant material EM3. The band gap corresponds to an energy difference between a lowest unoccupied molecular orbital (LUMO) and a highest occupied molecular orbital (HOMO).

In the first organic EL element OLED1, since the band gap of the first dopant material EM1 that is included in the red light emission layer EML1 is smallest, no energy transition occurs to other layers. Therefore, the first organic EL element OLED1 emits red light, and neither the green light emission layer EML2 nor blue light emission layer EML3 emits light.

In the second organic EL element OLED2, the first dopant material EM1 of the red light emission layer EML1 is in an optical quenching state. The optical quenching state refers to a state in which the dopant material absorbs ultraviolet and thus decomposition, polymerization or a change in molecular structure occurs in the dopant material, and, as a result, light emission does not occur or light emission hardly occurs. In the red light emission layer EML1 of the second organic EL element OLED2, the first dopant material EM1 emits no light. Even if the first dopant material EM1 is in the optical quenching state, the band gap in the red light emission layer EML1 is substantially equal to or less than the band gap prior to the optical quenching.

At this time, in the red light emission layer EML1 of the second organic EL element OLED2, the hole injectability or hole transportability of the red light emission layer EML1 increases by the ultraviolet irradiation for the optical quenching of the first dopant material EM1, and the hole mobility becomes higher than in the state prior to the ultraviolet radiation. Hence, in the second organic EL element OLED2, the balance between electrons and holes varies, and the light emission position shifts to the green light emission layer EML2. Therefore, the second organic EL element OLED2 emits green light, and the blue light emission layer EML3 emits no light.

In the third organic EL element OLED3, the first dopant material EM1 of the red light emission layer EML1 and the second dopant material EM2 of the green light emission layer EML2 are in the optical quenching state. In the red light emission layer EML1 of the third organic EL element OLED3, the first dopant material EM1 emits no light. In addition, in the green light emission layer EML2 of the third organic EL element OLED3, the second dopant material EM2 emits no light. Even if the first dopant material EM1 is in the optical quenching state, the band gap in the red light emission layer EML1 is substantially equal to or less than the band gap prior to the optical quenching. In addition, even if the second dopant material EM2 is in the optical quenching state, the band gap in the green light emission layer EML2 is substantially equal to or less than the band gap prior to the optical quenching.

At this time, in the red light emission layer EML1 of the third organic EL element OLED3, like the second organic EL element OLED2, the hole injectability or hole transportability increases. Similarly, in the green light emission layer EML2 of the third organic EL element OLED3, the hole injectability or hole transportability of the green light emission layer EML2 increases by the ultraviolet irradiation for the optical quenching of the second dopant material EM2, and the hole mobility becomes higher than in the state prior to the ultraviolet radiation. Hence, in the third organic EL element OLED3, the balance between electrons and holes varies, and the light emission position shifts to the blue light emission layer EML3. Therefore, the third organic EL element OLED3 emits blue light.

Figure 4:
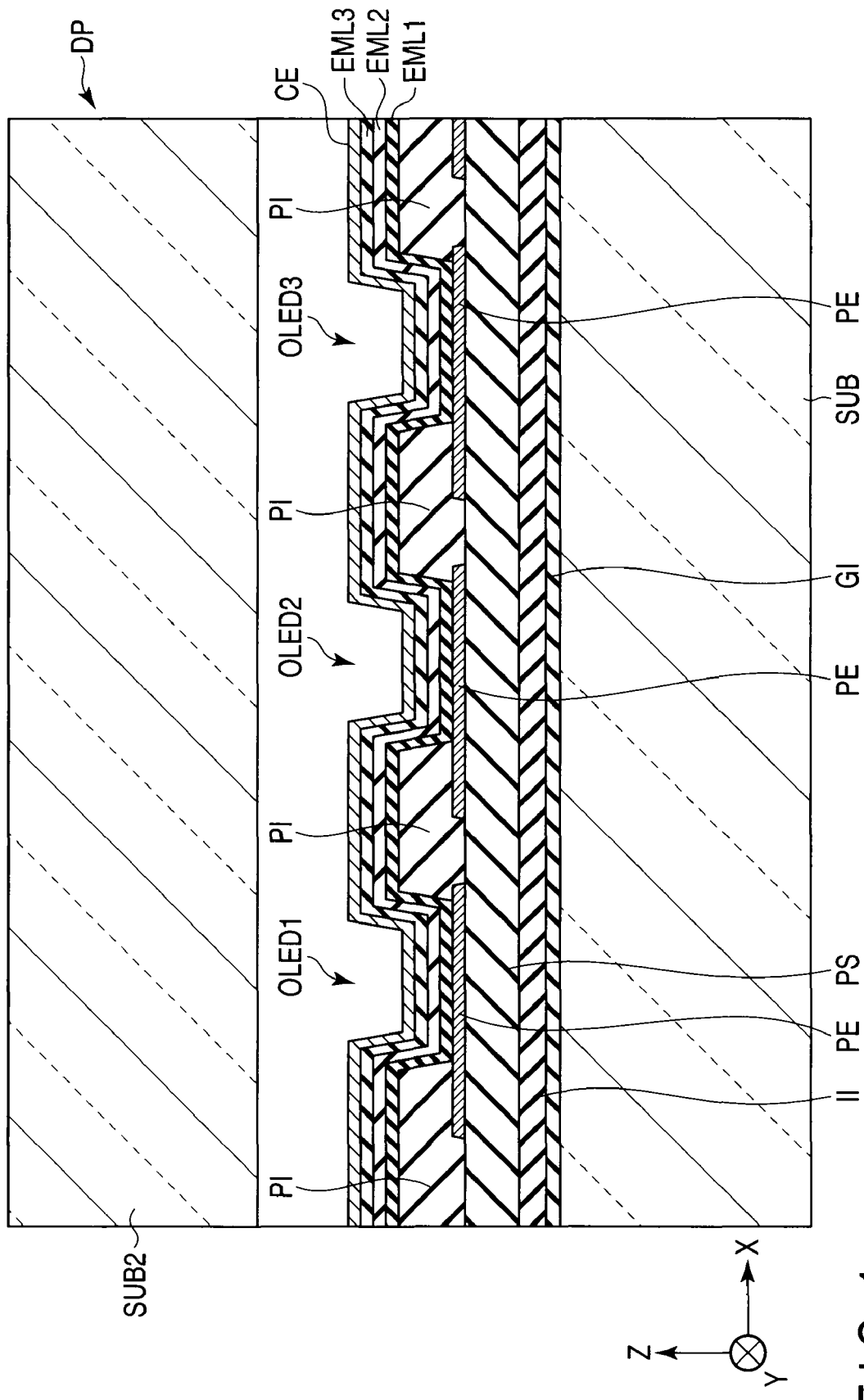
FIG. 4 is a cross-sectional view which schematically shows the structure of the first to third organic EL elements shown in FIG. 3.

FIG. 4 schematically shows the cross-sectional structure of the first to third organic EL elements OLED1 to OLED3. The cross-sectional structure shown in FIG. 4 does not include the switching transistor.

As shown in FIG. 4, the gate insulation film GI, interlayer insulation film II and passivation film PS are interposed between the substrate SUB and each of the first to third organic EL elements OLED1 to OLED3. Each pixel electrode PE is disposed on the passivation film PS.

The red light emission layer EML1 is disposed on each of the pixel electrodes PE of the first to third organic EL elements OLED1 to OLED3. The red light emission layer EML1 extends over the first to third organic EL elements OLED1 to OLED3.

Specifically, the red light emission layer EML1 is a continuous film spreading over the display region, and is disposed common to the first to third organic EL elements OLED1 to OLED3. In addition, the red light emission layer EML1 is disposed on each of the partition walls PI which are disposed between the first organic EL element OLED1 and second organic EL element OLED2, between the second organic EL element OLED2 and third organic EL element OLED3, and between the third organic EL element OLED3 and first organic EL element OLED1.

The green light emission layer EML2 extends over the first to third organic EL elements OLED1 to OLED3, and is disposed on the red light emission layer EML1. Specifically, the green light emission layer EML2 is a continuous film spreading over the display region.

The blue light emission layer EML3 extends over the first to third organic EL elements OLED1 to OLED3, and is disposed on the green light emission layer EML2. Specifically, the blue light emission layer EML3 is a continuous film spreading over the display region.

The counter-electrode CE extends over the first to third organic EL elements OLED1 to OLED3, and is disposed on the blue light emission layer EML3. Specifically, the counter-electrode CE is a continuous film spreading over the display region.

The first to third organic EL elements OLED1 to OLED3 are sealed by using the sealing glass substrate SUB2.

Figure 5:
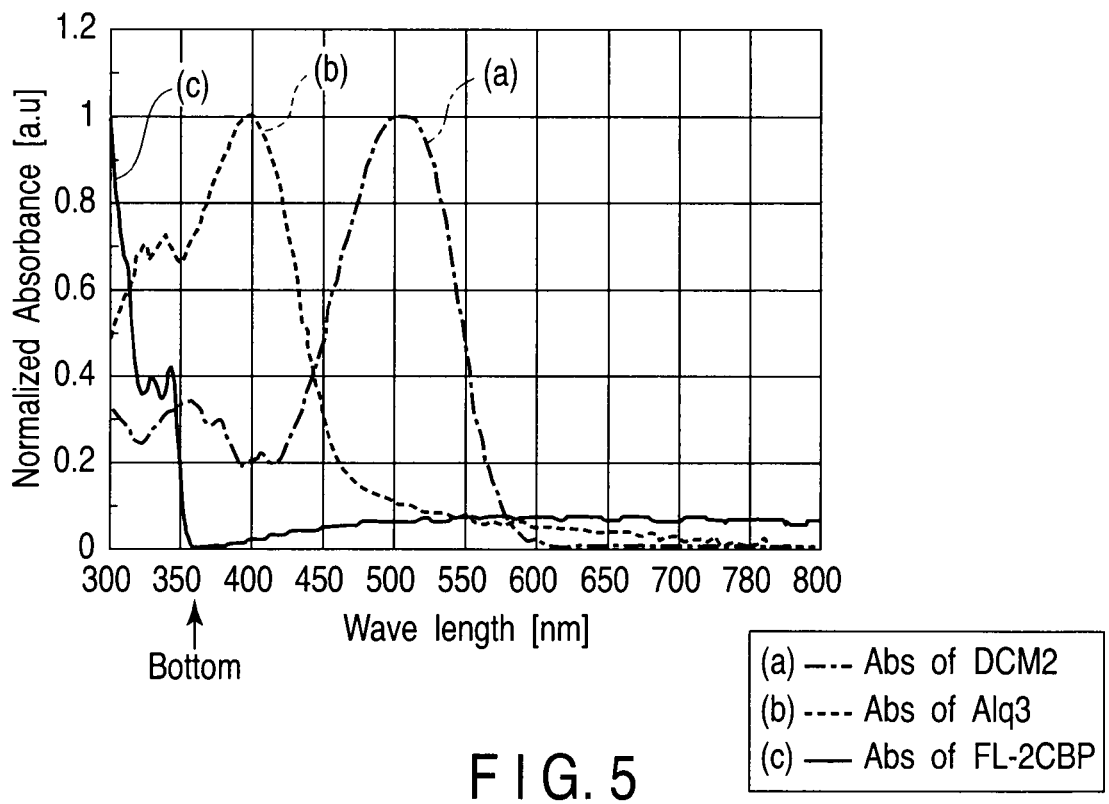
FIG. 5 is a graph showing light absorbance spectrum characteristics of a first dopant material, a second dopant material, a first host material and a second host material, which are adopted in the organic EL display device shown in FIG. 2.

FIG. 5 shows normalized light absorbance spectrum characteristics of DCM2 that is the first dopant material EM1, $Alq_3$ that is the second dopant material EM2, and FL-2CBP that is the first host material HM1 and the second material HM2.

DCM2 that is the first dopant material EM1 has absorbance spectrum characteristics which are indicated by (a) in FIG. 5, and has an absorbance peak in the vicinity of the wavelength of 500 nm. $Alq_3$ that is the second dopant material EM2 has absorbance spectrum characteristics which are indicated by (b) in FIG. 5, and has an absorbance peak in the vicinity of the wavelength of 400 nm.

FL-2CBP that is the first host material HM1 and the second host material HM2 has absorbance spectrum characteristics which are indicated by (c) in FIG. 5, and has an absorbance peak in the vicinity of the wavelength of 300 nm and a substantial absorbance bottom between the wavelength of 350 nm and the wavelength of 400 nm. In the normalized absorbance spectrum characteristics, the absorbance bottom corresponds to a region where the normalized absorbance decreases to a minimum. In the case where the absorbance spectrum characteristics have substantially an L shape curve, as in the example shown in FIG. 5, that part of the bottom side of the L shape curve, which is located on the shortest wavelength side, is referred to as "absorbance bottom". Although not shown, in the case where the absorbance spectrum characteristics have substantially a U shape curve, that part of the U shape curve, which has a lowest normalized absorbance, is referred to as "absorbance bottom". In the normalized absorbance spectrum characteristics, the normalized absorbance is 10% or less at the absorbance bottom.

As regards the FL-2CBP, on the shorter wavelength side than the wavelength of 350 nm, the normalized absorbance is 10% or more. The absorbance bottom appears in the vicinity of the wavelength of 360 nm, and the normalized absorbance is generally 10% or less on the longer wavelength side. In short, the absorbance bottom of the FL-2CBP occurs on the shorter wavelength side than the absorbance peaks of the first dopant material EM1 and second dopant material EM2.

Figure 6:
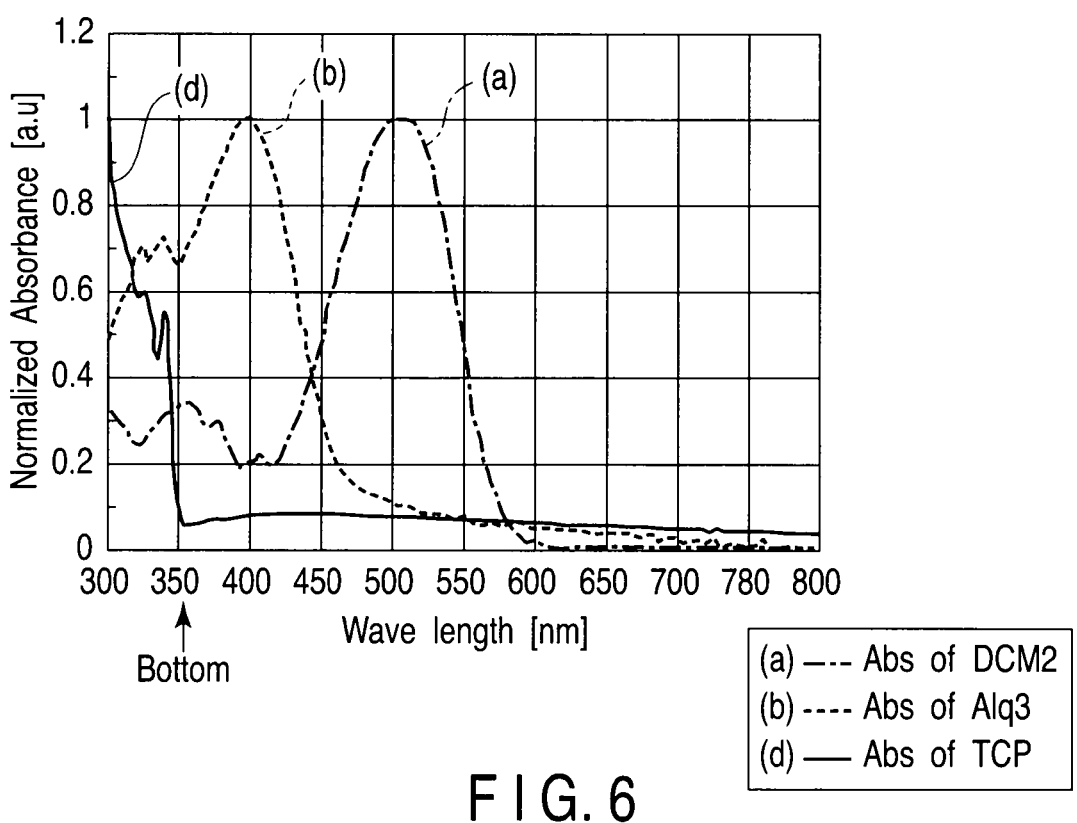
FIG. 6 is a graph showing light absorbance spectrum characteristics of another first host material and another second host material, which can be adopted in the organic EL display device shown in FIG. 2.

FIG. 6 shows normalized light absorbance spectrum characteristics of DCM2 that is the first dopant material EM1, $Alq_3$ that is the second dopant material EM2, and TCP that is applicable as the first host material HM1 and the second host material HM2.

In FIG. 6, (a) and (b) indicate absorbance spectrum characteristics of DCM2 and $Alq_3$. TCP has absorbance spectrum characteristics which are indicated by (d) in FIG. 6, and has an absorbance peak in the vicinity of the wavelength of 300 nm and a substantial absorbance bottom between the wavelength of 350 nm and the wavelength of 400 nm. As regards the TCP, on the shorter wavelength side than the wavelength of 350 nm, the normalized absorbance is 10% or more. The absorbance bottom appears in the vicinity of the wavelength of 355 nm, and the normalized absorbance is generally 10% or less on the longer wavelength side. In short, the absorbance bottom of the TCP occurs on the shorter wavelength side than the absorbance peaks of the first dopant material EM1 and second dopant material EM2.

In FIG. 5 and FIG. 6, (a) and (b) indicate the absorbance spectrum characteristics in the state in which no optical quenching occurs in the first dopant material EM1 and second dopant material EM2. In the absorbance spectrum characteristics in the state in which the optical quenching occurs in the first dopant material EM1 and second dopant material EM2, the absorbance peaks may slightly become lower than in the state before the optical quenching, or the wavelengths at which the absorbance peaks occur may slightly vary. However, the absorption peaks do not greatly vary, compared to the state before the optical quenching. In particular, the wavelengths at which the absorbance peaks occur do not shift to the shorter wavelength side than the absorbance bottom of the first host material HM1 and second host material HM2.

Next, referring to a flow chart of FIG. 7, a description is given of an example of a manufacturing method of the first to third organic EL elements OLED1 to OLED3.

To start with, in an array process, a pixel electrode PE is formed on a passivation film.

Then, in an EL process, a red light emission layer EML1 including a first dopant material EM1 is formed by a vacuum evaporation method by using a rough mask in which an opening corresponding to the display region is formed. In FIG. 7, this step is indicated by "EML1 EVAPORATION".

Then, regions, which correspond to the pixel PX2 in which the second organic EL element OLED2 is formed and the pixel PX3 in which the third organic EL element OLED3 is formed, are irradiated with light in a range of wavelengths of about 355 to 800 nm with an intensity in a range of 0.001 to 1.0 mW·mm$^{-2}$·nm$^{-1}$. In this example, the intensity of irradiation light is set at about 0.1 mW·mm$^{-2}$·nm$^{-1}$. In FIG. 7, this step is indicated by "PHOTO1 EXPOSURE".

In the exposure step indicated by "PHOTO1 EXPOSURE", in the pixels PX2 and PX3 which are irradiated with light with the wavelengths of about 355 to 800 nm, the first dopant material EM1 in the red light emission layer EML1 absorbs the irradiation light since the first dopant material EM1 has an absorbance peak in the vicinity of 500 nm. Thereby, the optical quenching occurs in the first dopant material EM1 due to decomposition, polymerization or a change in molecular structure. On the other hand, in the pixels PX2 and PX3, the normalized absorbance of the first host material HM1 in the wavelength range of irradiation light is relatively low and is 10% or less. Thus, even if the first host material HM1 absorbs the irradiation light, there occurs no decomposition, polymerization or change in molecular structure.

Subsequently, a green light emission layer EML2 including a second dopant material EM2 is formed by a vacuum evaporation method by using a rough mask in which an opening corresponding to the display region is formed. In FIG. 7, this step is indicated by "EML2 EVAPORATION".

Then, the region, which corresponds to the pixel PX3 is irradiated with light in a range of wavelengths of about 355 to 800 nm with an intensity in a range of 0.001 to 1.0 mW·mm$^{-2}$·nm$^{-1}$. In this example, the intensity of irradiation light is set at about 0.1 mW·mm$^{-2}$·nm$^{-1}$. In FIG. 7, this step is indicated by "PHOTO2 EXPOSURE". In the meantime, ultraviolet lights with different wavelengths may be radiated in the "PHOTO1 EXPOSURE" and "PHOTO2 EXPOSURE".

In the exposure step indicated by "PHOTO2 EXPOSURE", in the pixel PX3 which is irradiated with light with the wavelengths of about 355 to 800 nm, the second dopant material EM2 in the green light emission layer EML2 absorbs the irradiation light since the second dopant material EM2 has an absorbance peak in the vicinity of 400 nm. Thereby, the optical quenching occurs in the second dopant material EM2 due to decomposition, polymerization or a change in molecular structure. On the other hand, in the pixel PX3, the normalized absorbance of the second host material HM2 in the wavelength range of irradiation light is relatively low and is 10% or less. Thus, even if the second host material HM2 absorbs the irradiation light, there occurs no decomposition, polymerization or change in molecular structure.

Subsequently, a blue light emission layer EML3 including a third dopant material EM3 is formed on the green light emission layer EML2 by a vacuum evaporation method by using a rough mask in which an opening corresponding to the display region is formed. In FIG. 7, this step is indicated by "EML3 EVAPORATION".

Then, a counter-electrode CE is formed on the blue light emission layer EML3. In FIG. 7, this step is indicated by "CE EVAPORATION".

Thereafter, a step of sealing by the sealing glass substrate SUB2 is performed.

Figure 8:
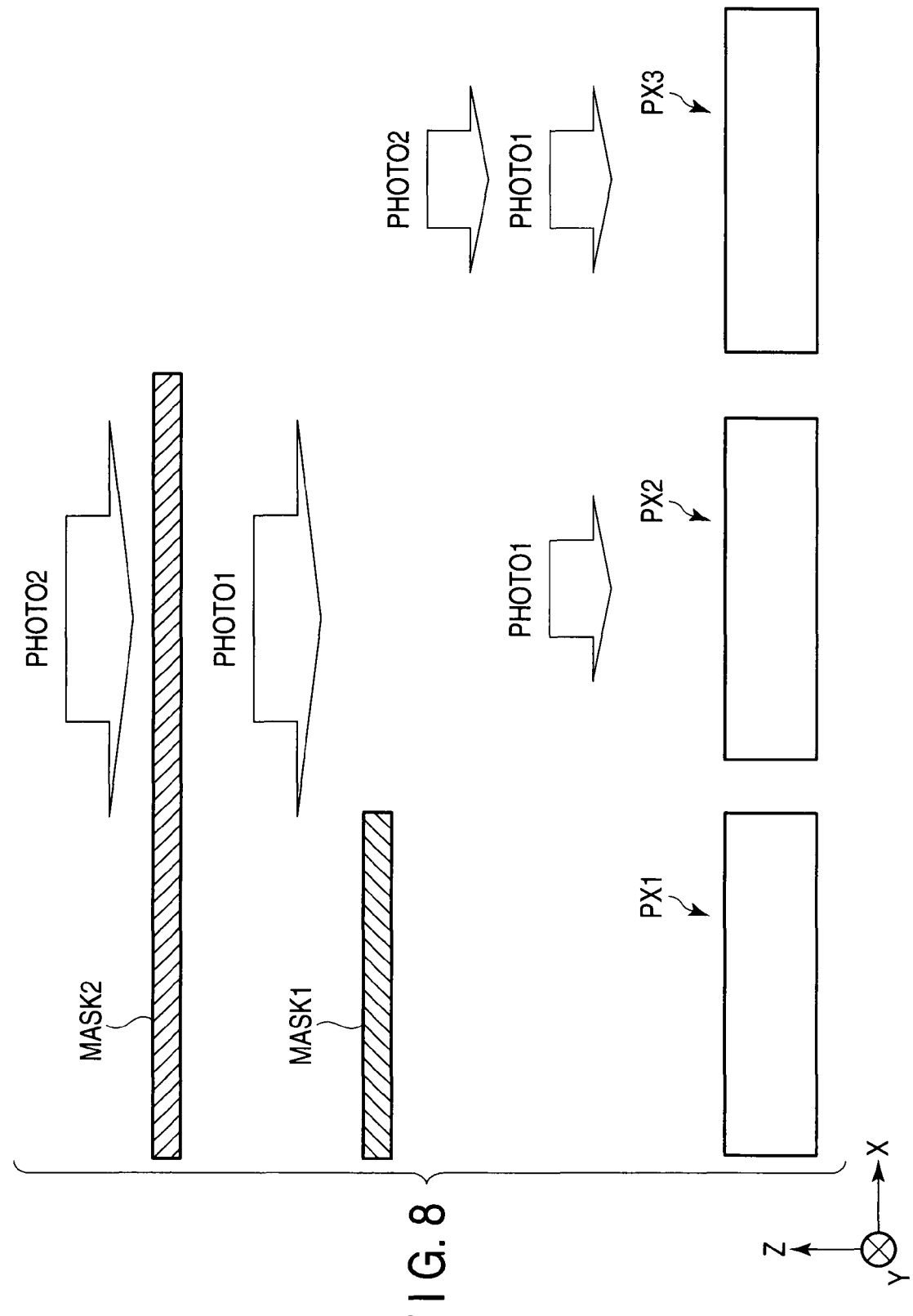
FIG. 8 is a view for explaining exposure steps which are indicated by "PHOTO1 EXPOSURE" and "PHOTO2 EXPOSURE" in FIG. 7.

As shown in FIG. 8, in the exposure step indicated by "PHOTO1", light is radiated by using a photomask MASK1 which shields the pixel PX1 from light and has an opening facing the pixels PX2 and PX3. Thereby, in the red light emission layer EML1 that is formed in the preceding step, the first dopant material EM1 of the red light emission layer EML1 that is formed in the pixels PX2 and PX3 absorbs light and transitions into an optical quenching state.

In the subsequent exposure step indicated by "PHOTO2", light is radiated by using a photomask MASK2 which shields the pixel PX1 and pixel PX2 from light and has an opening facing the pixel PX3. Thereby, in the green light emission layer EML2 that is formed in the preceding step, the second dopant material EM2 of the green light emission layer EML2 that is formed in the pixel PX3 absorbs light and transitions into an optical quenching state.

As described above, the red light emission layer EML1, green light emission layer EML2 and blue light emission layer EML3 are the continuous films extending over the first to third organic EL elements OLED1 to OLED3. Similarly, the counter-electrode CE is the continuous film extending over the first to third organic EL elements OLED1 to OLED3. Thus, when these films are formed by the evaporation method, a fine mask in which a fine opening is formed is needless, and the manufacturing cost of the mask can be reduced. In addition, when these films are formed, the amount of material deposited on the mask decreases, and the efficiency of use of the material of the films is enhanced. Moreover, since there is no need to selectively apply the light-emitting materials, a defect of color mixture can be prevented.

Besides, the second organic EL element OLED2 emits green light since the first dopant material EM1 of the red light emission layer EML1 is in the optical quenching state. The third organic EL element OLED3 emits blue light since the first dopant material EM1 of the red light emission layer EML1 and the second dopant material EM2 of the green light emission layer EML2 are in the optical quenching state. Accordingly, full-color display with high fineness can be realized.

When the optical quenching is effected in the first dopant material EM1 of the red light emission layer EML1 and the second dopant material EM2 of the green light emission layer EML2, the productivity of the organic EL display device can be more improved as the exposure time in the PHOTO1 exposure and PHOTO2 exposure is shorter.

As means for shortening the exposure time, there is a method of increasing the intensity of exposure. The radiation light wavelength of a high-pressure mercury lamp, which is a light source of a general exposure device, is in the range of 200 to 600 nm, and the peak wavelength, at which the emission light intensity takes a maximum value, is 365 nm in the emission light spectrum characteristics.

If all wavelengths of the radiation light of the high-pressure mercury lamp are utilized for exposure, the radiation intensity increases, but the wavelengths include wavelengths of light which is absorbed by not only the first dopant material EM1 and second dopant material EM2, but also the first host material HM1 and second host material HM2. Consequently, there may possibly occur decomposition, polymerization or a change in molecular structure in the first host material HM1 and second host material HM2.

It is thinkable to radiate light of wavelengths, which is hardly absorbed by the first host material HM1 and second host material HM2 but is absorbed by only the first host material HM1 and second host material HM2. In such a case, however, an optical element for selecting wavelengths is needed. In addition, at the time of exposure, the radiation intensity decreases due to the limitation of radiation wavelengths, and also the radiation intensity at the time when the radiation light passes through the optical element decreases due to, e.g. absorption of light by the optical element itself. Consequently, since the exposure intensity decreases and the exposure time increases, the productivity may possibly deteriorate.

No decomposition, polymerization or change in molecular structure is caused in the first host material HM1 and second host material HM2 by radiating light that has wavelengths, which are longer than the absorbance bottoms in the absorbance spectrum characteristics of the first host material HM1 included in the red light emission layer EML1 and the second host material HM2 included in the green light emission layer EML2, as the wavelengths of light for use in the exposure steps of "PHOTO1 EXPOSURE" and "PHOTO2 EXPOSURE".

On the other hand, the first dopant material EM1 and second dopant material EM2, which are to be set in the optical quenching state, have absorption peaks in the absorbance spectrum characteristics on the longer wavelength side than the absorbance bottom of the first host material HM1 and second host material HM2. In the exposure steps of "PHOTO1 EXPOSURE" and "PHOTO2 EXPOSURE", light is radiated which has the wavelengths including wavelengths in the vicinity of the absorbance bottom of the first host material HM1 and second host material HM2, and wavelengths longer than these wavelengths in the vicinity of the absorbance bottom. Specifically, as the exposure wavelengths in each exposure step, use can be made of the wavelengths in the range longer than the wavelengths in the ultraviolet range (200 to 400 nm) at which the normalized absorbance of the first host material HM1 and second host material HM2 is 10% or less, and all wavelengths in the visible light range. This wavelength range includes the peak wavelength of the high-pressure mercury lamp that is the light source. Therefore, the exposure intensity can be kept at a high level, and the productivity can be improved by the decrease in exposure time.

A description is given of examples of variations of elements, which can be adopted in the first to third organic EL elements OLED1 to OLED3 in the present embodiment.

For example, the organic layer ORG of each of the first to third organic EL elements OLED1 to OLED3 may include a hole injection layer and a hole transport layer on the pixel electrode side. In this case, the hole injection layer is disposed on the pixel electrode PE, and the hole transport layer is disposed on the hole injection layer. In addition, the organic layer ORG of each of the first to third organic EL elements OLED1 to OLED3 may include an electron injection layer and an electron transport layer on the counter-electrode side. In this case, the electron transport layer is disposed on the blue light emission layer EML3, and the electron injection layer is disposed on the electron transport layer. The hole injection layer, hole transport layer, electron injection layer and electron transport layer can be formed by a vacuum evaporation method by using a rough mask.

The pixel electrode PE of each of the first to third organic EL elements OLED1 to OLED3 may have a two-layer structure in which a reflective layer and a transmissive layer are stacked, or may have a single transmissive layer structure or a single reflective layer structure. The reflective layer can be formed of a light-reflective, electrically conductive material such as silver (Ag) or aluminum (Al). The light-transmissive layer can be formed of a light-transmissive, electrically conductive material such as indium tin oxide (ITO) or indium zinc oxide (IZO). In the case where the pixel electrode PE has the two-layer structure comprising the reflective layer and transmissive layer, the reflective layer is disposed on the passivation film PS, and the transmissive layer is disposed on the reflective layer.

The counter-electrode CE may have a two-layer structure in which a semi-transmissive layer and a transmissive layer are stacked, or may have a single transmissive layer structure or a single semi-transmissive layer structure. The semi-transmissive layer can be formed of an electrically conductive material such as magnesium or silver. The transmissive layer can be formed of a light-transmissive, electrically conductive material such as ITO or IZO.

The first to third organic EL elements OLED1 to OLED3 may adopt a top-emission-type structure in which emission light is extracted from the counter-electrode side. In this case, the pixel electrode PE of each of the first to third organic EL elements OLED1 to OLED3 includes at least a reflective layer.

The first to third organic EL elements OLED1 to OLED3 may adopt a micro-cavity structure which comprises a pixel electrode PE having a reflective layer, and a counter-electrode CE having a semi-transmissive layer.

In the case where the micro-cavity structure is adopted, a light-transmissive thin film, for instance, silicon oxynitride (SiON) or ITO, may be disposed on the counter-electrode CE. Such a thin film is usable as a protection film for protecting the first to third organic EL elements OLED1 to OLED3, and is also usable as an optical matching layer for adjusting the optical path length for optimizing optical interference. Moreover, a light-transmissive insulation film, for instance, silicon nitride (SiN), may be disposed between the reflective layer of the pixel electrode PE and the semi-transmissive layer of the counter-electrode CE. Such an insulation film is usable as an adjusting layer for adjusting an optical interference condition. The optical path length of such an adjusting layer is set at a least common multiple of ¼ of the wavelength of emission light of each of the first to third organic EL elements OLED1 to OLED3. Such an adjusting layer may be disposed only in the first organic EL element OLED1 and the second organic EL element OLED2.

Of the first to third organic EL elements OLED1 to OLED3, at least the first organic EL element OLED1 and the second organic EL element OLED2 may include an irregular scattering layer which is disposed between the pixel electrode PE and the passivation film PS.

In the present embodiment, the description has been given of the case in which the hole injectability or hole transportability in the red light emission layer EML1 and green light emission layer EML2 is increased by the ultraviolet irradiation for causing optical quenching in the first dopant material EM1 of the red light emission layer EML1 and the second dopant material EM2 of the green light emission layer EML2. Alternatively, the same advantageous effect can be obtained in the case in which the hole injectability or hole transportability in the red light emission layer EML1 and green light emission layer EML2 is decreased by the ultraviolet irradiation.

A description is given of examples of variations which can be adopted in the manufacturing method of the first to third organic EL elements OLED1 to OLED3.

The exposure step that is indicated by "PHOTO1 EXPOSURE" may be performed at any timing, if the timing is after the step of forming the red light emission layer EML1, which is indicated by "EML1 EVAPORATION". For example, the exposure step indicated by "PHOTO1 EXPOSURE" may be performed after the step of forming the green light emission layer EML2 which is indicated by "EML2 EVAPORATION", or after the step of forming the blue light emission layer EML3 which is indicated by "EML3 EVAPORATION", or after the step of forming the counter-electrode CE which is indicated by "CE EVAPORATION".

The exposure step that is indicated by "PHOTO2 EXPOSURE" may be performed at any timing, if the timing is after the step of forming the green light emission layer EML2, which is indicated by "EML2 EVAPORATION". For example, the exposure step indicated by "PHOTO2 EXPOSURE" may be performed after the step of forming the blue light emission layer EML3 which is indicated by "EML3 EVAPORATION", or after the step of forming the counter-electrode CE which is indicated by "CE EVAPORATION".

In the case of the structure in which the organic layer ORG of each of the first to third organic EL elements OLED1 to OLED3 includes the hole transport layer, a step of forming the hole transport layer and a step of exposing the hole transport layer may be added prior to the step of forming the red light emission layer EML1 which is indicated by "EML1 EVAPORATION".

In the case of the structure in which the organic layer ORG of each of the first to third organic EL elements OLED1 to OLED3 includes the electron transport layer, a step of forming the electron transport layer and a step of exposing the electron transport layer may be added after the step of forming the blue light emission layer EML3 which is indicated by "EML3 EVAPORATION".

In the present embodiment, the description has been given of the case in which two exposure steps indicated by "PHOTO1 EXPOSURE" and "PHOTO2 EXPOSURE" are performed. Alternatively, by making use of a halftone mask, the optical quenching may be caused to occur in the first dopant material EM1 and second dopant material EM2 by a single exposure step. This halftone exposure step may be performed at any timing, if the timing is after the step of forming the green light emission layer EML2. The halftone mask, which is used in this case, has different transmittances corresponding to the respective regions where the first to third organic EL elements OLED1 to OLED3 are to be formed. Specifically, the transmittance corresponding to the region where the third organic EL element OLED3 is to be formed is higher than the transmittance corresponding to the region where the second organic EL element OLED2 is to be formed. The transmittance corresponding to the region where the second organic EL element OLED2 is to be formed is higher than the transmittance corresponding to the region where the first organic EL element OLED1 is to be formed. Thereby, the exposure step is simplified, and the productivity is improved.

In the exposure steps indicated by "PHOTO1 EXPOSURE" and "PHOTO2 EXPOSURE", it is preferable that the oxygen concentration in the exposure device be set at 20 ppm. Under this condition of the oxygen concentration, the optical quenching in the first dopant material EM1 and second dopant material EM2 is promoted.

For example, FL-2CBP is used as the host material, tri(2-phenylpyridine)iridium (III) (abbreviation: Ir(ppy)3) is used as the dopant material, and a thin film with a thickness of 30 nm and a dopant concentration of 8% is formed on a glass substrate by a vacuum evaporation method. Light of 355 nm or more was radiated for 10 minutes on this formed thin film by using a mercury xenon lamp light source, both in the environment in which the oxygen concentration is 1 ppm or less and the environment in which the oxygen concentration is 20 ppm.

Before and after the light radiation, the photoluminescence intensity (PL intensity) was compared by a photoluminescence method. In the case where the PL intensity before the light radiation is assumed to be 100%, the PL intensity decreased to 49% after the light radiation in the environment in which the oxygen concentration is 1 ppm, and the PL intensity decreased to 38% after the light radiation in the environment in which the oxygen concentration is 20 ppm.

As described above, in the case of irradiation of light with wavelengths of 355 nm or more, a variation, such as decomposition of FL-2CBP that is the host material is suppressed, and thus it can be assumed that the decrease in PL intensity by the light radiation occurs due to the optical quenching of the dopant material. Therefore, in the exposure steps indicated by "PHOTO1 EXPOSURE" and "PHOTO2 EXPOSURE", by performing the exposure in the environment in which the oxygen concentration is 20 ppm or more, the optical quenching of the dopant material can be effected in a shorter time, and the productivity can be enhanced.

Next, a description is given of an example of a polarization control element which is applicable to the exposure steps indicated by "PHOTO1 EXPOSURE" and "PHOTO2 EXPOSURE".

Figure 9:
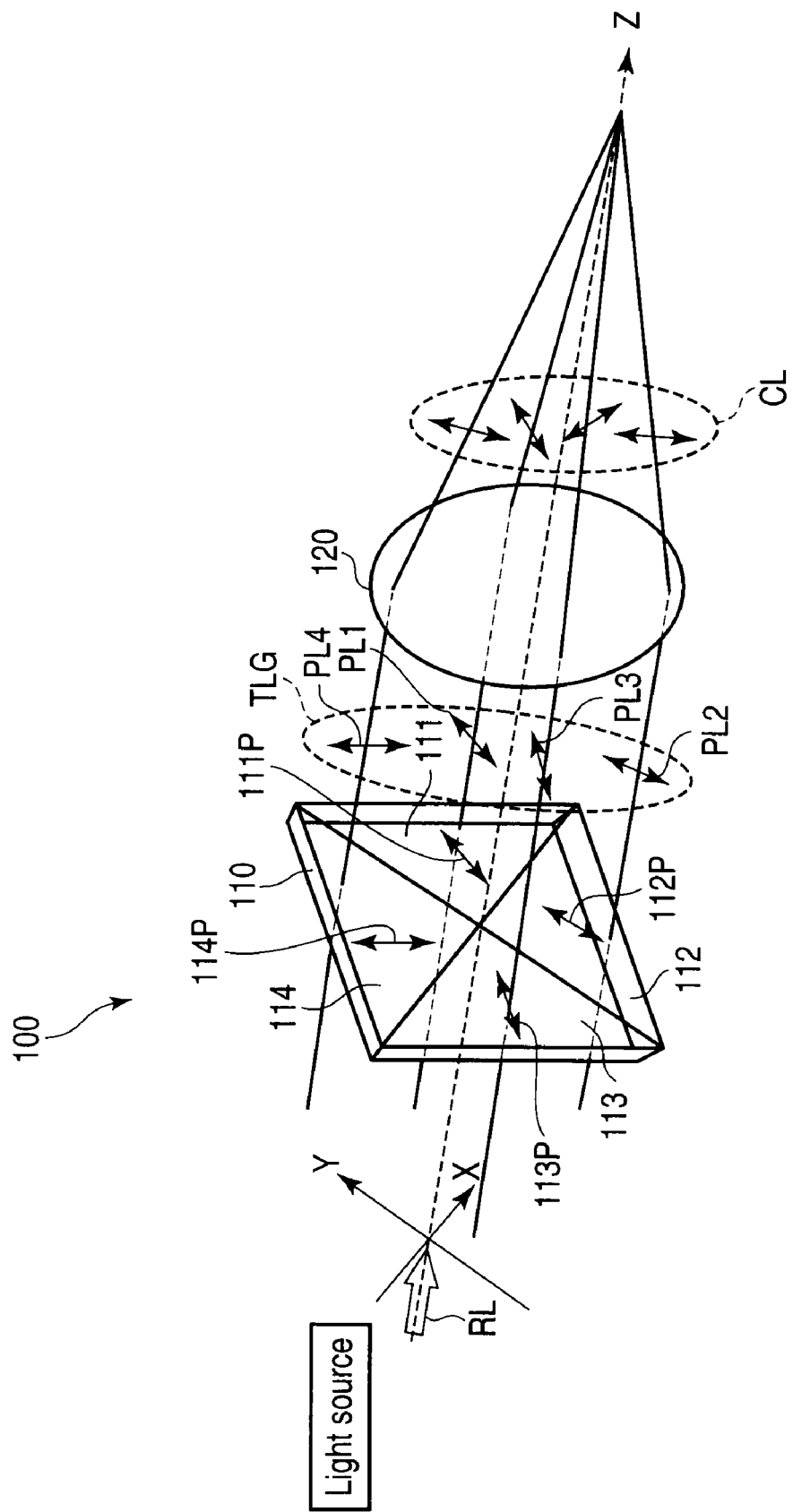
FIG. 9 schematically shows the structure of a polarization control element which generates a Z-polarization light component.

FIG. 9 shows a structure example of a polarization control element 100. In FIG. 9, the direction of travel of light is set to be a Z direction, and directions that are perpendicular to each other in a plane perpendicular to the Z direction are set to be an X direction and a Y direction. The polarization control element 100 is constructed by combining a polarization modulation element 110 which generates, from radiation light RL from a light source, linearly polarized light rays in a plurality of different directions in the X-Y plane, and a lens 120 which collects the linearly polarized light rays coming out of the polarization modulation element 110.

The polarization modulation element 110 can be composed of a liquid crystal panel which is configured to hold a liquid crystal layer between a pair of substrates. In particular, a liquid crystal panel of a mode, in which linearly polarized light rays in a plurality of different directions can be produced from light passing through a liquid crystal display panel, for instance, a twisted nematic mode or an in-plane switching mode, is suitable.

The polarization modulation element 110 includes a first quadrant 111, a second quadrant 112, a third quadrant 113 and a fourth quadrant 114. The polarization modulation element 110 is configured such that the phases of transmissive light rays, which pass through the first to fourth quadrants, are different. Thus, the directions of optical axes 111P to 114P of the light rays, which pass through the first to fourth quadrants 111 to 114, are different in the X-Y plane. Although FIG. 9 shows the example in which the polarization modulation element 110 includes the four quadrants 111 to 114, it is preferable that the polarization modulation element 110 have at least four quadrant regions for varying the polarization state of the radiation light RL from the light source.

An example of the method of forming the quadrant regions in which the polarization axes of transmissive light rays are different in the liquid crystal panel, which constitutes the polarization modulation element 110, is a method in which the combination of the "tilt angle in a rubbing treatment process" and the "application voltage for controlling liquid crystal alignment" is varied among the quadrant regions.

In the polarization control element 100 having the above-described structure, radiation light RL from the light source first enters the polarization modulation element 110. Transmissive light including an X-polarization light component and a Y-polarization light component, which have different phases, emerges from each of the first to fourth quadrant regions 111 to 114. A transmissive light ray group TLG, which comprises transmissive light rays from the first to fourth quadrant regions 111 to 114, includes linearly polarized light rays PL1 to PL4 which are parallel to polarization axes 111P to 114P of the first to fourth quadrant regions 111 to 114. Specifically, the transmissive light emerging from the first quadrant region 111 is the linearly polarized light PL1, the transmissive light emerging from the second quadrant region 112 is the linearly polarized light PL2, the transmissive light emerging from the third quadrant region 113 is the linearly polarized light PL3, and the transmissive light emerging from the fourth quadrant region 114 is the linearly polarized light PL4.

The transmissive light ray group TLG, which comes out of the polarization modulation element 110, is incident on the lens 120 and is collected. Thereby, a Z-polarization light component is generated in addition to the X-polarization light component and Y-polarization light component. In short, light CL, which is collected by the lens 120, includes the X-polarization light component, Y-polarization light component and Z-polarization light component. The X-polarization light component, in this case, is a polarization light component which is parallel to the X direction, the Y-polarization light component is a polarization light component which is parallel to the Y direction, and the Z-polarization light component is a polarization light component which is parallel to the Z direction.

Each of the transmissive light rays emerging from the first to fourth quadrant regions 111 to 114 includes the X-polarization light component and Y-polarization light component, which have different phases. Thus, the canceling function due to interference with other transmissive light rays emerging from the other quadrant regions can be reduced. Preferably, the phases of the transmissive light rays, which have passed through the first quadrant region 111, second quadrant region 112, third quadrant region 113 and fourth quadrant regions 114, are displaced at equal intervals. For example, a phase difference between the transmissive light, which has passed through an i-th quadrant region (i=1 to N−1; N is an integer of 4 or more) of the polarization modulation element 110, and the transmissive light, which has passed through the neighboring (i+1)th quadrant region, should preferably be $\lambda/(4 \times (N-1))$.

Figure 10:
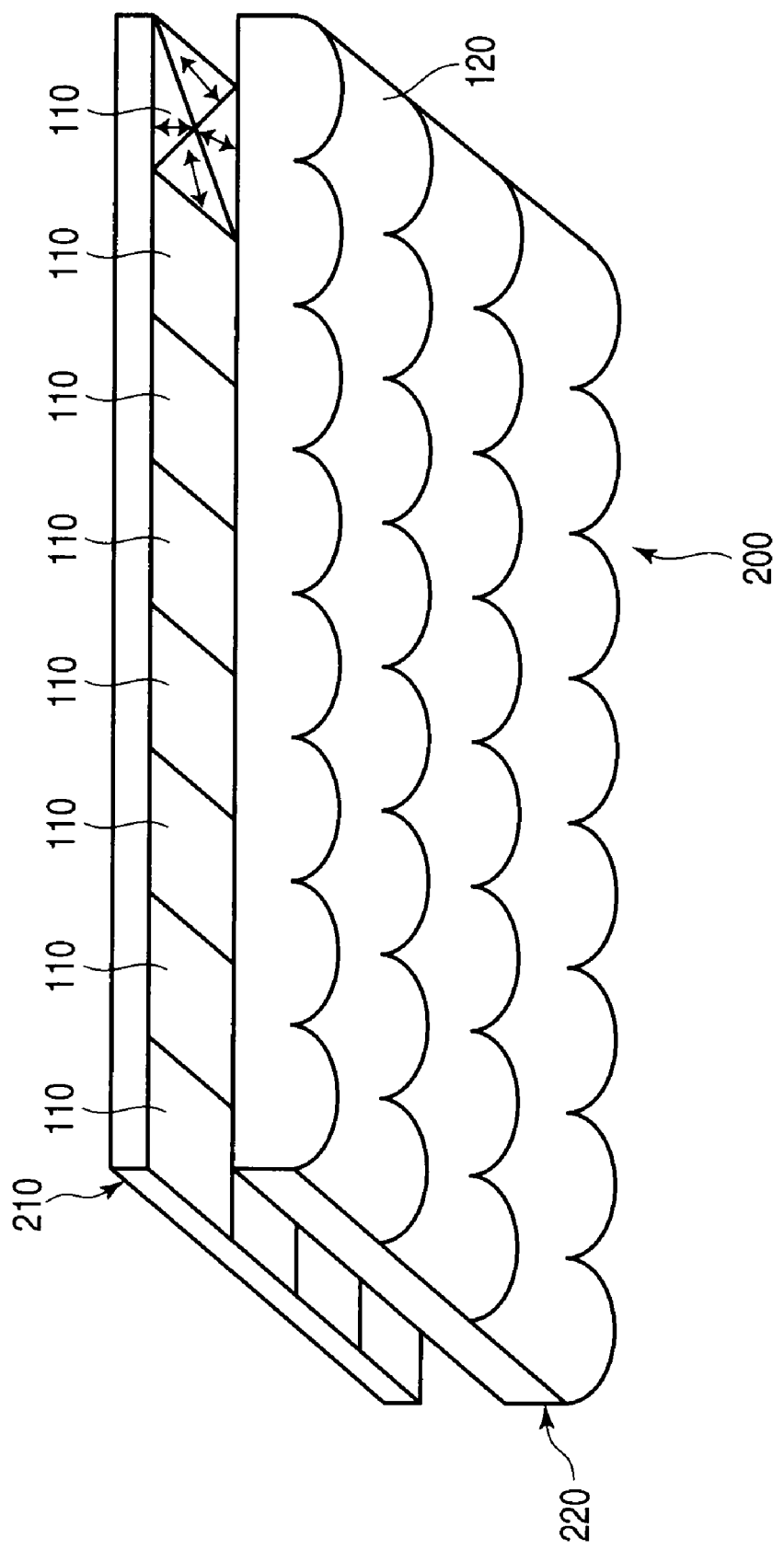
FIG. 10 schematically shows the structure of a polarization control unit which includes the polarization control element shown in FIG. 9.

FIG. 10 shows a structure example of a polarization control element unit 200 which is applicable to an actual exposure device. Specifically, the polarization control element unit 200 includes, as shown in FIG. 9, a polarization modulation element unit 210 in which polarization modulation elements 110 are disposed in a matrix, and a lens array unit 220 in which lenses 120 corresponding to the polarization modulation elements 110 are integrated.

The polarization control element unit 200 having this structure is applied to the exposure steps indicated by "PHOTO1 EXPOSURE" and "PHOTO2 EXPOSURE". Thereby, light can efficiently be absorbed by the first dopant material EM1 which is included in the red light emission layer EML1 and the second dopant material EM2 which is included in the green light emission layer EML2. The reason for this is described below.

Thin films, such as the red light emission layer EML1 and green light emission layer EML2, which are formed by evaporation methods, have amorphous structures. Thus, the orientation directions of molecules of the first dopant material EM1 and second dopant material EM2, which are included in the red light emission layer EML1 and green light emission layer EML2, are random.

In some cases, the light absorbance of molecules of the first dopant material EM1 and the second dopant material EM2 greatly varies according to directions of polarization. In such cases, it is possible that the thin film of the amorphous structure includes molecules in which the absorbance for the Z-polarization light component is higher than the absorbance for the X-polarization light component and Y-polarization light component. Thus, in the case of radiating light including only the X-polarization light component and Y-polarization light component, there is a concern that the exposure time for causing optical quenching in the first dopant material EM1 and second dopant material EM2 increases, and the production efficiency deteriorates.

Thus, in the case where the first dopant material EM1 and second dopant material EM2 include molecules with relatively high absorbance for the X-polarization light component, molecules with relatively high absorbance for the Y-polarization light component and molecules with relatively high absorbance for the Z-polarization light component, the light including the Z-polarization light component, as well as the X-polarization light component and Y-polarization light component, is radiated in the exposure steps indicated by "PHOTO1 EXPOSURE" and "PHOTO2 EXPOSURE". Thereby, light can efficiently be absorbed in the respective molecules, and the optical quenching can be effected in a short exposure time. Therefore, the production efficiency can be improved.

As has been described above, it is possible to provide an organic EL display device, which can effect full-color display with high fineness, without using a fine mask.

The present invention is not limited directly to the above-described embodiments. In practice, the structural elements can be modified and embodied without departing from the spirit of the invention. Various inventions can be made by properly combining the structural elements disclosed in the embodiments. For example, some structural elements may be omitted from all the structural elements disclosed in the embodiments. Furthermore, structural elements in different embodiments may properly be combined.

In the above-described embodiment, the organic EL display device includes three kinds of organic EL elements with different emission light colors, namely, the first to third organic EL elements OLED1 to OLED3. Alternatively, the organic EL display device may include, as organic EL elements, only two kinds of organic EL elements with different emission light colors, or four or more kinds of organic EL elements with different emission light colors.

In the present embodiment, the description has been given of the case in which when the dopant material is in an optical quenching state, no light is emitted at all from the dopant material. However, if the same advantageous effect can be obtained, the invention is applicable to the case in which when the dopant material is in an optical quenching state, light is hardly emitted from the dopant material.

What is claimed is:
1. An organic EL display device comprising:
a pixel electrode which is disposed in each of first to third organic EL elements having different emission light colors;

a first light emission layer which includes a first dopant material having a first absorbance peak in absorbance spectrum characteristics and a first host material having a first absorbance bottom on a shorter wavelength side than the first absorbance peak, the first light emission layer extending over the first to third organic EL elements and being disposed above the pixel electrodes of the first to third organic EL elements;

a second light emission layer which includes a second dopant material having a second absorbance peak in absorbance spectrum characteristics and a second host material having a second absorbance bottom on a shorter wavelength side than the first absorbance peak and than the second absorbance peak, the second light emission layer extending over the first to third organic EL elements and being disposed above the first light emission layer;

a third light emission layer which includes a third dopant material and a third host material, the third light emission layer extending over the first to third organic EL elements and being disposed above the second light emission layer; and a counter-electrode which extends over the first to third organic EL elements and is disposed above the third light emission layer.

2. The organic EL display device according to claim 1, wherein the first dopant material of the second organic EL element is in an optical quenching state, and the first dopant material and the second dopant material of the third organic EL element are in an optical quenching state.

3. The organic EL display device according to claim 1, wherein the first host material and the second host material have an absorbance of 10% or less at wavelengths of 350 nm or more in normalized absorbance spectrum characteristics thereof.

4. The organic EL display device according to claim 1, wherein at least one of the first dopant material, the second dopant material and the third dopant material is a phosphorescent material.

5. An organic EL display device comprising:

a pixel electrode which is disposed in each of first to third organic EL elements having different emission light colors;

a first light emission layer which includes a first dopant material having a first absorbance peak and a first host material having a first absorbance bottom, at which a normalized absorbance in normalized absorbance spectrum characteristics is 10% or less, on a shorter wavelength side than the first absorbance peak, the first light emission layer extending over the first to third organic EL elements and being disposed above the pixel electrodes of the first to third organic EL elements;

a second light emission layer which includes a second dopant material having a second absorbance peak and a second host material having a second absorbance bottom, at which a normalized absorbance in normalized absorbance spectrum characteristics is 10% or less, on a shorter wavelength side than the first absorbance peak and than the second absorbance peak, the second light emission layer extending over the first to third organic EL elements and being disposed above the first light emission layer;

a third light emission layer which includes a third dopant material and a third host material, the third light emission layer extending over the first to third organic EL elements and being disposed above the second light emission layer; and a counter-electrode which extends over the first to third organic EL elements and is disposed above the third light emission layer.

6. The organic EL display device according to claim 5, wherein the first dopant material of the second organic EL element is in an optical quenching state, and the first dopant material and the second dopant material of the third organic EL element are in an optical quenching state.

7. The organic EL display device according to claim 5, wherein at least one of the first dopant material, the second dopant material and the third dopant material is a phosphorescent material.

8. A manufacturing method of an organic EL display device, comprising:

a step of forming a pixel electrode in association with each of first to third organic EL elements having different emission light colors;

a step of forming above the pixel electrode a first light emission layer by using a first dopant material having a first absorbance peak in absorbance spectrum characteristics and a first host material having a first absorbance bottom on a shorter wavelength side than the first absorbance peak, the first light emission layer extending over the first to third organic EL elements;

a step of forming above the first light emission layer a second light emission layer by using a second dopant material having a second absorbance peak in absorbance spectrum characteristics and a second host material having a second absorbance bottom on a shorter wavelength side than the first absorbance peak and than the second absorbance peak, the second light emission layer extending over the first to third organic EL elements;

a step of forming above the second light emission layer a third light emission layer by using a third dopant material and a third host material, the third light emission layer extending over the first to third organic EL elements; and a step of forming above the third light emission layer a counter-electrode which extends over the first to third organic EL elements.

9. The manufacturing method of an organic EL display device, according to claim 8, further comprising an exposure step of causing optical quenching in the first dopant material of the second organic EL element and the third organic EL element, and in the second dopant material of the third organic EL element.

10. The manufacturing method of an organic EL display device, according to claim 9, wherein in the exposure step, in a case where a direction of travel of light is set to be a Z direction and directions perpendicular to each other in a plane perpendicular to the Z direction are set to be an X direction and a Y direction, light including a polarization light component in the Z direction, as well as polarization light components in the X direction and Y direction, is radiated.

11. The manufacturing method of an organic EL display device, according to claim 10, wherein in the exposure step, light is radiated with use of a polarization control element which is constructed by combining a polarization modulation element which generates, from radiation light from a light source, linearly polarized light rays in a plurality of different directions in an X-Y plane, and a lens which collects the linearly polarized light rays coming out of the polarization modulation element.

12. The manufacturing method of an organic EL display device, according to claim 11, wherein the polarization modulation element is a liquid crystal panel.

13. The manufacturing method of an organic EL display device, according to claim 11, wherein the polarization modulation element includes at least four quadrant regions which vary a polarization state of the radiation light from the light source, and transmissive light rays emerging from the respective quadrant regions have different phases.

14. The manufacturing method of an organic EL display device, according to claim 13, wherein a phase difference between light coming out of an i-th quadrant region (i=1 to N−1; N is an integer of 4 or more) of the polarization modulation element, and light coming out of a neighboring (i+1)th quadrant region, is $\lambda/(4\times(N-1))$.

* * * * *